United States Patent
Sugawara

(10) Patent No.: US 7,489,573 B2
(45) Date of Patent: Feb. 10, 2009

(54) NONVOLATILE SEMICONDUCTOR MEMORY DEVICE AND METHOD OF TESTING THEREOF

(75) Inventor: Hiroshi Sugawara, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 82 days.

(21) Appl. No.: 11/806,315

(22) Filed: May 31, 2007

(65) Prior Publication Data
US 2007/0280004 A1    Dec. 6, 2007

(30) Foreign Application Priority Data
Jun. 2, 2006    (JP)    .............................. 2006-154567

(51) Int. Cl.
*G11C 7/00* (2006.01)
(52) U.S. Cl. .................................. 365/201; 365/185.28
(58) Field of Classification Search .................. 365/201, 365/185.28, 185.18
See application file for complete search history.

(56) References Cited

U.S. PATENT DOCUMENTS

| | | | |
|---|---|---|---|
| 6,606,273 B1 * | 8/2003 | Guo et al. | 365/201 |
| 2003/0035322 A1 * | 2/2003 | Wong | 365/185.33 |
| 2007/0230261 A1 * | 10/2007 | Haufe et al. | 365/201 |

FOREIGN PATENT DOCUMENTS

JP    2002-25279    1/2002

* cited by examiner

Primary Examiner—Vu A Le
(74) Attorney, Agent, or Firm—Young & Thompson

(57) ABSTRACT

A method of testing a nonvolatile semiconductor memory device is provided. The nonvolatile semiconductor memory device is provided with a memory cell of a field effect transistor type. The method includes: (A) performing erasing of the memory cell by using FN (Fowler-Nordheim) method; (B) performing programming back of the memory cell by using FN method, after the (A) step.

11 Claims, 9 Drawing Sheets

1: NONVOLATILE SEMICONDUCTOR MEMORY DEVICE

<CHE PROGRAM>

NONVOLATILE SEMICONDUCTOR MEMORY DEVICE AND METHOD OF TESTING THEREOF

BACKGROUND OF THE INVENTION

1. Field of the Invention

The present invention relates to a nonvolatile semiconductor memory device and a method of testing thereof. In particular, the present invention relates to a nonvolatile semiconductor memory device having a memory cell of a field effect transistor type, and a method of testing thereof.

2. Description of Related Art

A CHE (Channel Hot Electron) method is known as a programming method for an NOR type flash memory. According to the CHE method, programming is performed by injecting hot electrons generated in the vicinity of a drain of a memory cell into a floating gate. Also, an FN (Fowler-Nordheim) method is known as a programming/erasing method for a flash memory. According to the FN method, a high voltage is applied between a well or source and a control gate, and thereby an FN current flows between the well or source and the control gate. Due to the FN current, electrons are injected into the floating gate or electrons are extracted from the floating gate.

In the flash memory, erasing is performed collectively with respect to a group of memory cells included in one block. When the erasing is performed, electrons are extracted from the floating gate and thus a threshold voltage of the memory cell is decreased. One of issues relating to the erasing is "over-erasing". The over-erasing is a phenomenon that the threshold voltage of the memory cell becomes 0 V or less (depression level) as a result of the erasing operation. Since an off-leakage current flows from the memory cell in the depression state, the over-erased state needs to be resolved. Therefore, "programming back" is performed with respect to the over-erased memory cell.

A technique related to the programming back is described in Japanese Laid-Open Patent Application JP-2002-25279A. According to an erasing method described in the patent document, the erasing is performed in units of block on the basis of the FN method. More specifically, the erasing method includes the following three stages. The first stage: a first erase pulse is applied, and the threshold voltage of every memory cells in a block is set to be a voltage that is higher than 0 and equal to or lower than a first predetermined voltage corresponding to an erase state. The second stage: a second erase pulse is applied, and the above-mentioned threshold voltage is further decreased to a voltage equal to or lower than a second predetermined voltage that is lower than the first predetermined voltage. The third stage: a programming back pulse is applied, and the above-mentioned threshold voltage is increased to a voltage that is higher than 0.

The inventor of the present application has recognized the following points. In general, a group of memory cells included in a block of a flash memory has variation in erase characteristics. Among them there are a memory cell which is hardly over-erased and a memory cell which tends to be over-erased. Also, a defective memory cell in which a desired structure is not appropriately formed can be generated in a manufacturing process. It is desirable that the memory cell that tends to be over-erased and the defective memory cell as mentioned above are detected accurately in a test stage. If only such the memory cell having a defect is detected, a block including the detected memory cell can be replaced with a redundancy block. In that case, it is not necessary to eliminate a manufactured memory chip, which improves yield.

Meanwhile, if the memory cell having a defect is not detected accurately in the test stage, the memory chip is eventually eliminated as an operation defective product. This causes reduction of the yield. Alternatively, if the memory chip is not eliminated as an operation defective product, the memory chip may fail during actual use. This causes deterioration of reliability of the memory chip. In either case, it is important to accurately detect the memory cell having a defect in the test stage. That is to say, a technique that improves screening accuracy is desired.

SUMMARY

In one embodiment of the present invention, a nonvolatile semiconductor memory device is provided with a memory cell of a field effect transistor type. In a test/inspection stage, the state of the memory cell manufactured is checked and a potentially defective memory cell is detected. In order to enhance the detection accuracy of the defective memory cell, erasing based on the FN method is "intensively" performed with respect to all the memory cells. For example, the erasing operation in the test/inspection stage is performed for a much longer time than in actual use.

Due to the intensive erasing, the memory cell that tends to be over-erased is erased more deeply and hence becomes distinct, as compared with a normal memory cell. Moreover, since a high voltage peculiar to the FN method is applied to the memory cell for a long time, a memory cell with a film defect is destroyed. In this manner, it is possible to differentiate the memory cell having a defect from the normal memory cell.

Meanwhile, due to the intensive erasing, a lot of normal memory cells become the depression state. In order to detect in which block the memory cell having a defect exists, it is necessary to make the normal memory cells from the depression state back to a normal state. Obviously also, the depression state needs to be resolved in order to ship the memory chip. Therefore, after the intensive erasing is performed, programming back is performed with respect to all the memory cells.

It should be noted here that to perform the programming back by using the CHE method is virtually impossible. The reason is that a lot of memory cells are being in the depression state as a result of the intensive erasing. When the lot of memory cells are in the depression state, off-leakage currents flow from the lot of memory cells into a bit line. In this case, it is no longer possible to supply a sufficient program current to a programming-back-target memory cell. It is therefore impossible to perform the programming back on the basis of the CHE method.

Consequently, according to the present invention, the "FN method" is employed for the programming back during the test/inspection stage. According to the FN method, a program voltage is not applied to a drain of the memory cell and thus the off-leakage current becomes irrelevant. As a result of the programming back based on the FN method, the normal memory cells return from the depression state back to the normal state. The programming back based on the FN method is appropriately controlled such that the memory cell that tends to be over-erased is maintained in the depression state.

In this manner, the memory cell that tends to be over-erased and the memory cell having a film defect as mentioned above can be detected accurately. When such the memory cell having the defect is detected accurately, a block including the detected memory cell can be replaced with a redundancy block. As a result, the possibility that the memory chip is eliminated as an operation defective product is decreased.

Therefore, the yield is improved. Furthermore, since potentially defective memory cells are removed, the reliability of the memory chip as a product is improved.

As described above, the nonvolatile semiconductor memory device according to the embodiment of the present invention performs the programming back by using the FN method after performing the intensive erasing by using the FN method during a test mode. Consequently, it is possible to accurately detect the memory cell having a defect. To put it the other way around, since a mode to perform the programming back by the FN method is provided, it is possible to perform the intensive erasing in the test/inspection stage without constraint. Due to the intensive erasing, the screening with high accuracy can be achieved.

In a first aspect of the present invention, a nonvolatile semiconductor memory device is provided. The nonvolatile semiconductor memory device has a memory cell and a control circuit that controls programming/erasing of the memory cell. In response to a test signal indicating a test mode, the control circuit performs erasing of the memory cell by using the FN method and further performs programming back of the memory cell by using the FN method.

In a second aspect of the present invention, a nonvolatile semiconductor memory device is provided. The nonvolatile semiconductor memory device has a memory cell and a control circuit that controls programming/erasing of the memory cell. The control circuit switches a method of the programming between the FN method and the CHE method, depending on an operation mode.

In a third aspect of the present invention, a method of testing a nonvolatile semiconductor memory device is provided. The method includes: (A) performing erasing of the memory cell by using the FN method; and (B) performing programming back of the memory cell by using the FN method, after the (A) step.

According to the present invention, it is possible to accurately detect the memory cell having a defect in the test/inspection stage. That is to say, the screening accuracy is improved. As a result, the yield is improved and the reliability of a product is also enhanced.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

A nonvolatile semiconductor memory device and a method of testing thereof will be described below with reference to the attached drawings. The nonvolatile semiconductor memory device according to the embodiments is, for example, an NOR type flash memory.

1. First Embodiment 1-1. Configuration

Figure 1:
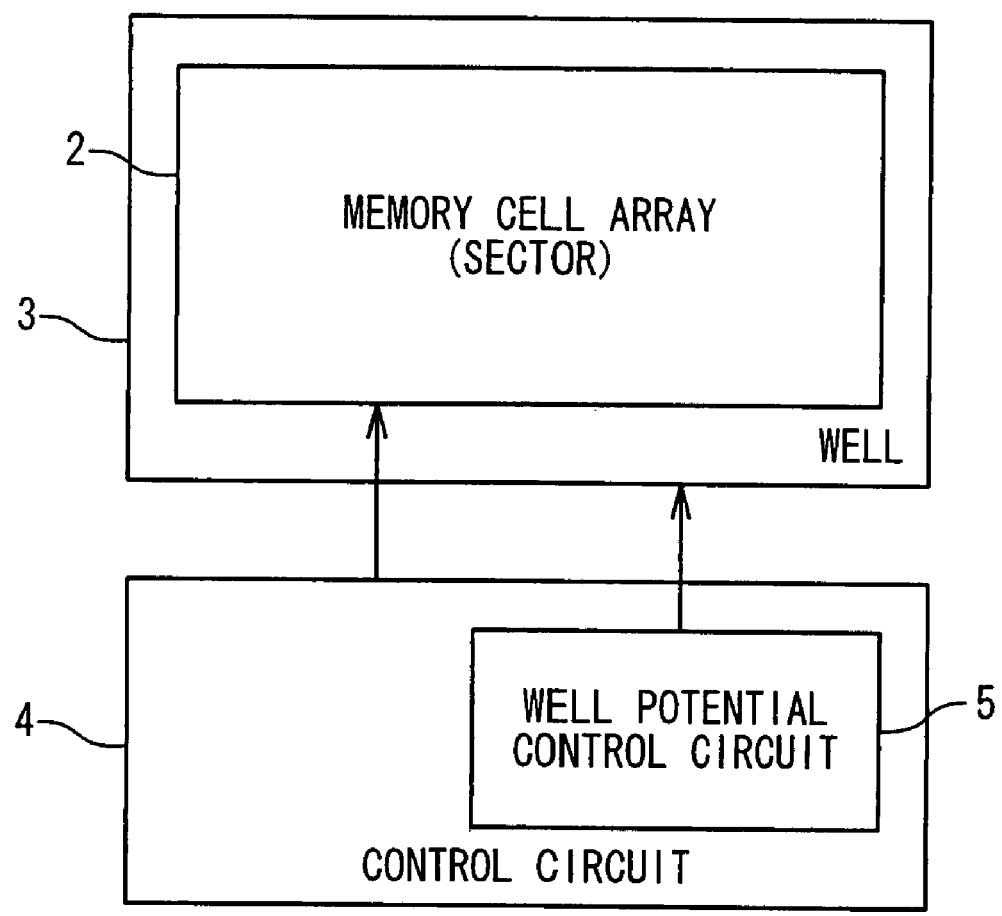
FIG. 1 is a block diagram showing a configuration of a nonvolatile semiconductor memory device according to a first embodiment of the present invention.

FIG. 1 schematically shows a configuration of a nonvolatile semiconductor memory device 1 according to a first embodiment of the present invention. The nonvolatile semiconductor memory device 1 is provided with a memory cell array 2 and a control circuit 4. The memory cell array (sector) 2 includes nonvolatile memory cells arranged in an array, and those memory cells are formed on a well 3 in a semiconductor substrate. The control circuit 4 controls programming and erasing of the memory cells. The control circuit 4 includes a well potential control circuit 5, and the well potential control circuit 5 controls well potential applied to the well 3 at the time of the programming/erasing.

Figure 2:
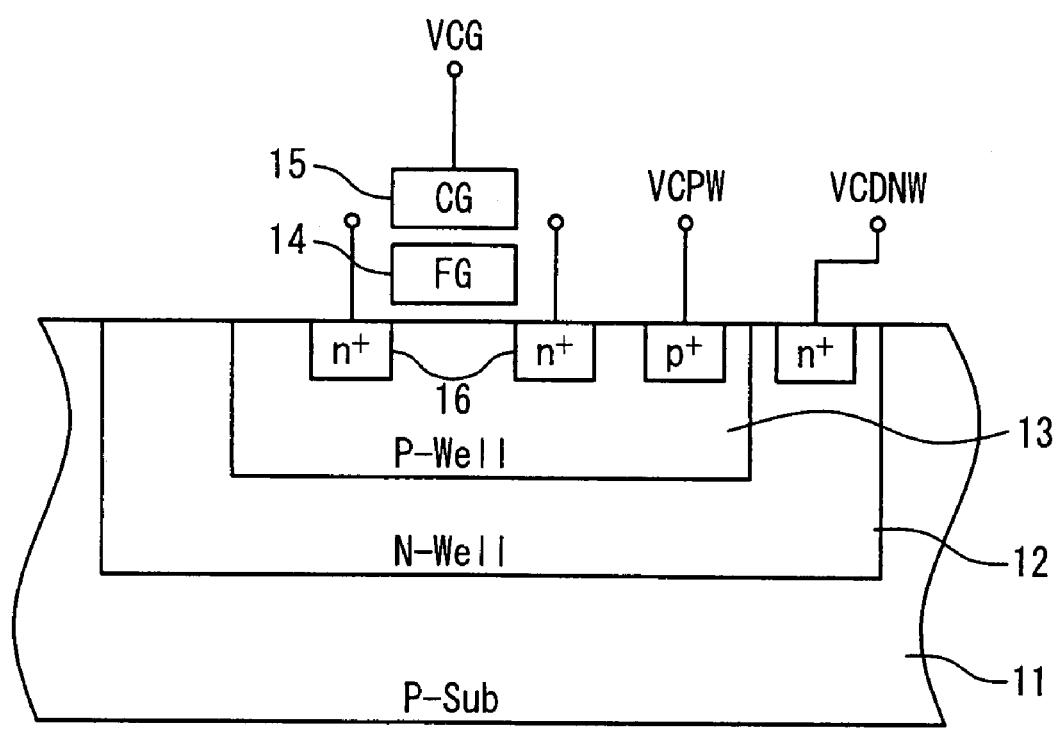
FIG. 2 is a schematic diagram showing an example of a nonvolatile memory cell.

The memory cell in the present embodiment is a nonvolatile memory cell of a field effect transistor type. For example, the memory cell is a stacked type memory cell or a split-gate type memory cell having a floating gate and a control gate. Also, the memory cell may be a MONOS (Metal-ONO-Silicon) transistor that has an ONO (Oxide-Nitride-Oxide) film as a charge storage film. FIG. 2 illustrates an example of a memory cell 10 according to the present embodiment. In FIG. 2, an N-well 12 is formed in a P-type semiconductor substrate 11, and a P-well 13 is formed in the N-well 12. A floating gate 14 is formed on the P-well 13 through a tunnel insulating film. A control gate 15 is formed on the floating gate 14 through an insulating film. Moreover, source/drain diffusion layers 16 are formed in the P-well 13 on both sides of the floating gate 14.

At the time of the programming and erasing of the memory cell 10, the control circuit 4 shown in FIG. 1 applies a predetermined control gate potential VCG to the control gate 15. The N-well 12 and the P-well 13 correspond to the well 3 shown in FIG. 1, and the well potential control circuit 5 applies the well potential to the N-well 12 and the P-well 13. More specifically, an N-well potential VCDNW is applied to the N-well 12, while a P-well potential VCPW is applied to the P-well 13.

Figure 3:
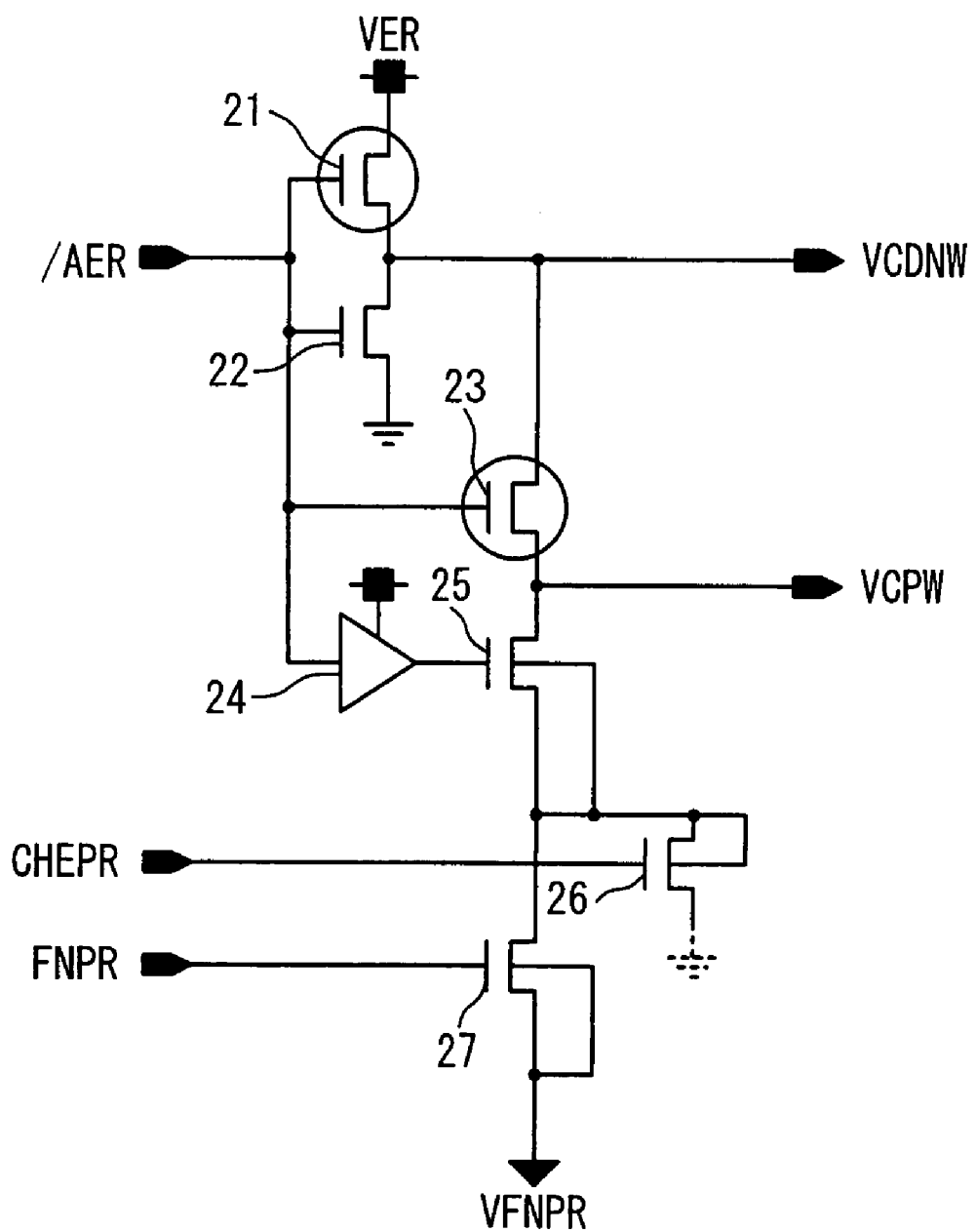
FIG. 3 is a circuit diagram showing a configuration of a well potential control circuit according to the first embodiment.

FIG. 3 shows an example of a circuit configuration of the well potential control circuit 5 according to the present embodiment. As shown in FIG. 3, the well potential control circuit 5 includes a P-channel MOS transistor (referred to as a PMOS hereinafter) 21, an N-channel MOS transistor (referred to as an NMOS hereinafter) 22, a PMOS 23, a buffer 24, and NMOSs 25 to 27.

The PMOS 21 and the NMOS 22 configure an inverter, and an erase signal /AER is input to the inverter. An output of the inverter is connected to the N-well 12, and also connected to the P-well 13 through the PMOS 23. The erase signal /AER is also input to a gate of the PMOS 23, and ON/OFF of the PMOS 23 is controlled by the erase signal /AER. Moreover, the erase signal /AER is also input to a gate of the NMOS 25 through the buffer 24 and controls ON/OFF of the NMOS 25.

A drain of the NMOS 25 is connected to the P-well 13, and a source thereof is connected to a ground and a power supply through the NMOSs 26 and 27, respectively. A CHE program signal CHEPR is input to a gate of the NMOS 26, and ON/OFF of the NMOS 26 is controlled by the CHE program signal CHEPR. The CHE program signal CHEPR is a signal which indicates programming based on the CHE method. On the other hand, an FN program signal FNPR is input to a gate of the NMOS 27, and ON/OFF of the NMOS 27 is controlled by the FN program signal FNPR. The FN program signal FNPR is a signal which indicates programming based on the FN method.

When the CHE program signal CHEPR is activated, a ground potential is applied as the P-well potential VCPW to the P-well 13. On the other hand, when the FN program signal FNPR is activated, an FN program potential VFNPR is applied as the P-well potential VCPW to the P-well 13. The FN program potential VFNPR is a negative potential. In this manner, the well potential control circuit 5 according to the present embodiment is configured to apply different P-well potentials VCPW to the P-well 13 depending on a program mode (CHE, FN).

1-2. Well Potential

Next, operations of the well potential control circuit 5 according to the present embodiment will be explained with reference to the following timing charts together with the foregoing FIG. 2 and FIG. 3. In particular, transitions of the N-well potential VCDNW applied to the N-well 12 and the P-well potential VCPW applied to the P-well 13 are shown.

(Erasing)

Figure 4:
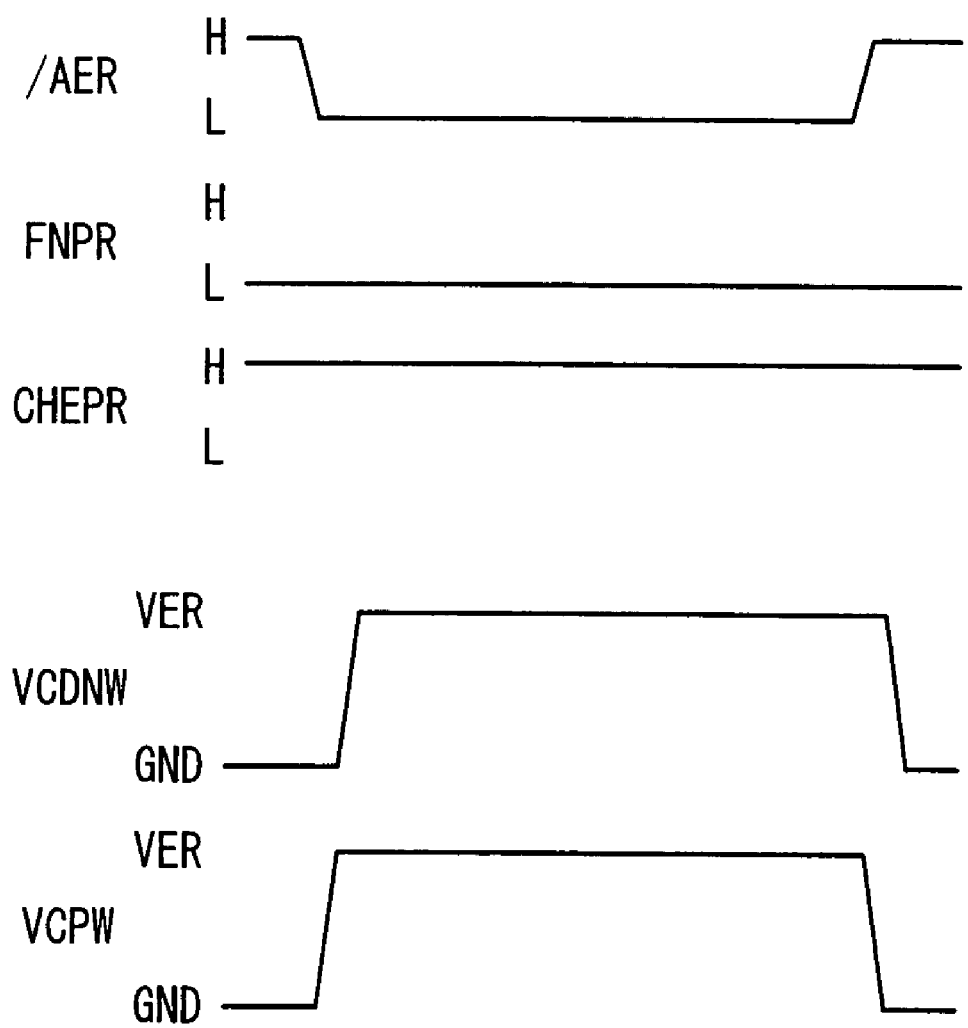
FIG. 4 is a timing chart showing an erase operation according to the present embodiment.

FIG. 4 is a timing chart showing an erase operation. In the erase operation, the erase signal /AER is activated and changed to the Low level. Therefore, the PMOSs 21 and 23 are turned on, while the NMOSs 22 and 25 are turned off. As a result, the N-well potential VCDNW and the P-well potential VCPW vary from a ground potential GND to an erase potential VER. The erase potential VER is a positive potential. That is, the positive erase potential VER is applied to the N-well 12 and the P-well 13. At this time, a predetermined negative potential VCG is applied to the control gate 15 by the control circuit 4. Accordingly, a high voltage is applied between the P-well 13 and the floating gate 14, and hence an FN current flows between the P-well 13 and the floating gate 14. Consequently, electrons are extracted from the floating gate 14 and thus a threshold voltage of the memory cell 10 is decreased. In this manner, the erasing is performed on the basis of the FN method.

When the erase signal /AER is changed back to the High level, the PMOSs 21 and 23 are turned off, while the NMOSs 22 and 25 are turned on. As a result, the N-well potential VCDNW and the P-well potential VCPW return to the ground potential GND, and the erase operation is finished. It should be noted that during the erase operation, the FN program signal FNPR is maintained at the Low level and the CHE program signal CHEPR is maintained at the High level.

(CHE Programming)

Figure 5:
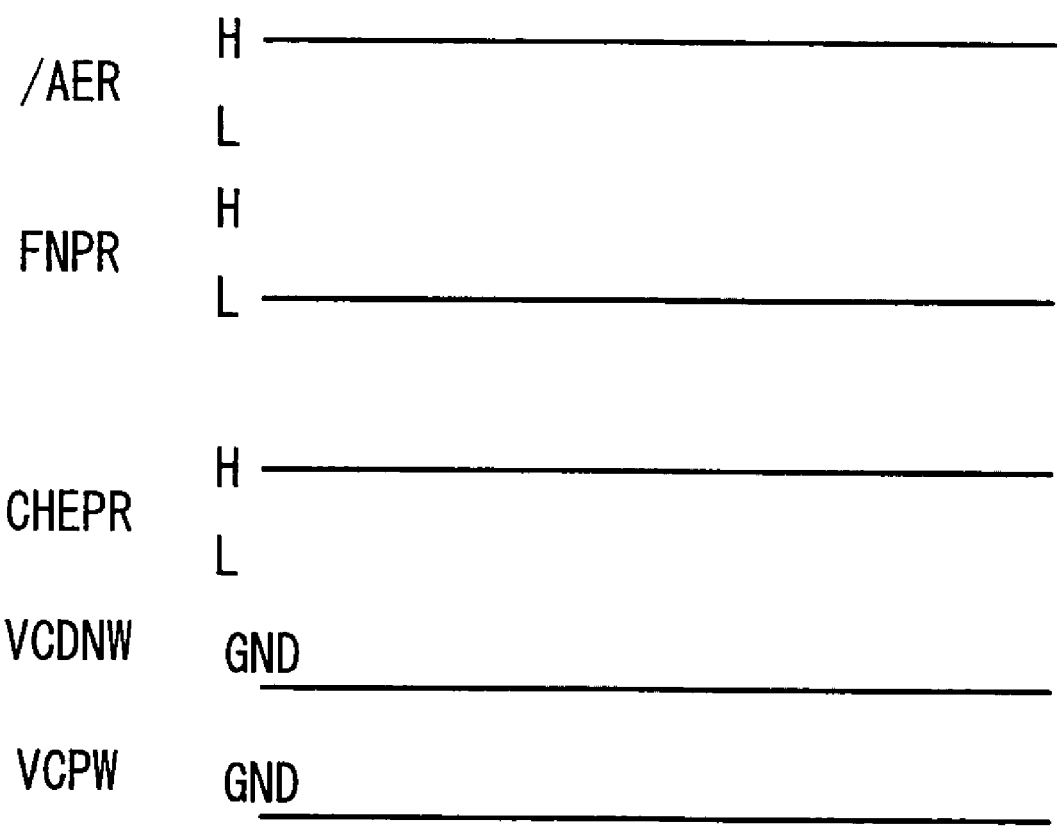
FIG. 5 is a timing chart showing a CHE program operation according to the present embodiment.

FIG. 5 is a timing chart showing a CHE program operation. In the CHE program operation, the erase signal /AER is the High level and the NMOSs 22 and 25 are turned on. As a result, the ground potential GND is applied as the N-well potential VCDNW to the N-well 12. The FN program signal FNPR is the Low level and the NMOS 27 is turned off.

Meanwhile, the CHE program signal CHEPR is the High level and the NMOS 26 is turned on. As a result, the ground potential GND is applied as the P-well potential VCPW to the P-well 13. The control circuit 4 applies predetermined program potentials to the control gate 15 and the drain of the memory cell 10, respectively. In this manner, the programming is performed on the basis of the CHE method.

(FN Programming)

Figure 6:
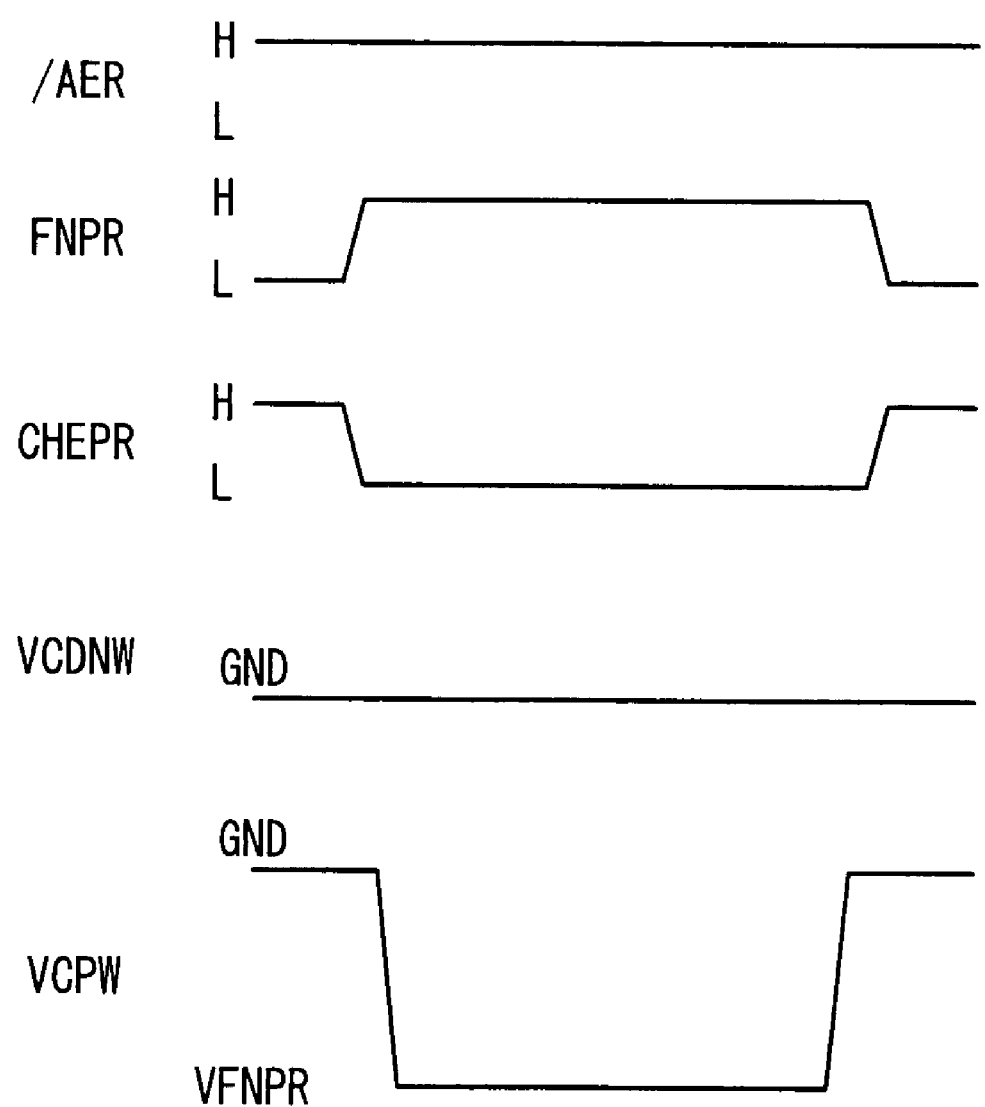
FIG. 6 is a timing chart showing an FN program operation according to the present embodiment.

FIG. 6 is a timing chart showing an FN program operation. In the FN program operation, the erase signal /AER is the High level and the NMOSs 22 and 25 are turned on. As a result, the ground potential GND is applied as the N-well potential VCDNW to the N-well 12.

In the FN program operation, the FN program signal FNPR is activated and changed from the Low level to the High level. Simultaneously, the CHE program signal CHEPR is changed from the High level to the Low level. Therefore, the NMOS 27 is turned on, while the NMOS 26 is turned off. As a result, the P-well potential VCPW varies from the ground potential GND to the FN program potential VFNPR. The FN program potential VFNPR is a negative potential (e.g. −9 V). That is, the negative potential VFNPR is applied to the P-well 13. At this time, a predetermined positive potential VCG (e.g. 9V) is applied to the control gate 15 by the control circuit 4. Therefore, a high voltage is applied between the P-well 13 and the floating gate 14, and hence an FN current flows between the P-well 13 and the floating gate 14. Consequently, electrons are injected into the floating gate 14 and thus the threshold voltage of the memory cell 10 is increased. In this manner, the programming is performed on the basis of the FN method.

When the FN program signal FNPR is changed back to the Low level, the NMOS 27 is turned off. Moreover, when the CHE program signal CHEPR is changed back to the High level, the NMOS 26 is turned on. As a result, the P-well potential VCPW returns to the ground potential GND, and the FN program operation is finished.

As described above, the well potential control circuit 5 according to the present embodiment has the CHE program mode and the FN program mode as the program mode. The program mode can be switched between the two modes.

1-3. Operation

The control circuit 4 shown in FIG. 1 is provided with the above-described well potential control circuit 5. In other words, the control circuit 4 is capable of switching a programming method between the FN method and the CHE method, depending on an operation mode. The operation mode includes a "test mode" that is used at the time of the test/inspection before the shipping of a product and a "normal mode" that is used at the time when the product operates in actual use. Operations of the control circuit 4 in the normal mode and the test mode will be explained below.

(Normal Mode)

At the time of programming during the normal mode, the operation mode is set to a "normal program mode". In the normal program mode, the control circuit 4 activates the CHE program signal CHEPR and performs the programming by using the "CHE method".

At the time of erasing during the normal mode, the operation mode is set to a "normal erase mode". In the normal erase mode, the control circuit 4 initially activates the erase signal /AER and performs the erasing of the memory cell by using the "FN method". After that, the control circuit 4 performs programming back in order to set a threshold voltage distribution of the memory cells proper. Here, the programming back in the normal erase mode is performed based on the "CHE method". That is to say, in response to the erase signal /AER, the control circuit 4 performs the erasing of the memory cell by using the FN method and further performs the programming back of the memory cell by using the CHE method.

(Test Mode)

The test mode is different from the normal mode, and not a mode which is actually used by a user of the product. The test mode is used at the test/inspection stage. In the test/inspection stage, the state of the memory cell manufactured is checked and a potentially defective memory cell is detected. In order to enhance the detection accuracy of the defective memory cell, the control circuit 4 according to the present embodiment performs a characteristic processing to be described below.

Figure 7:
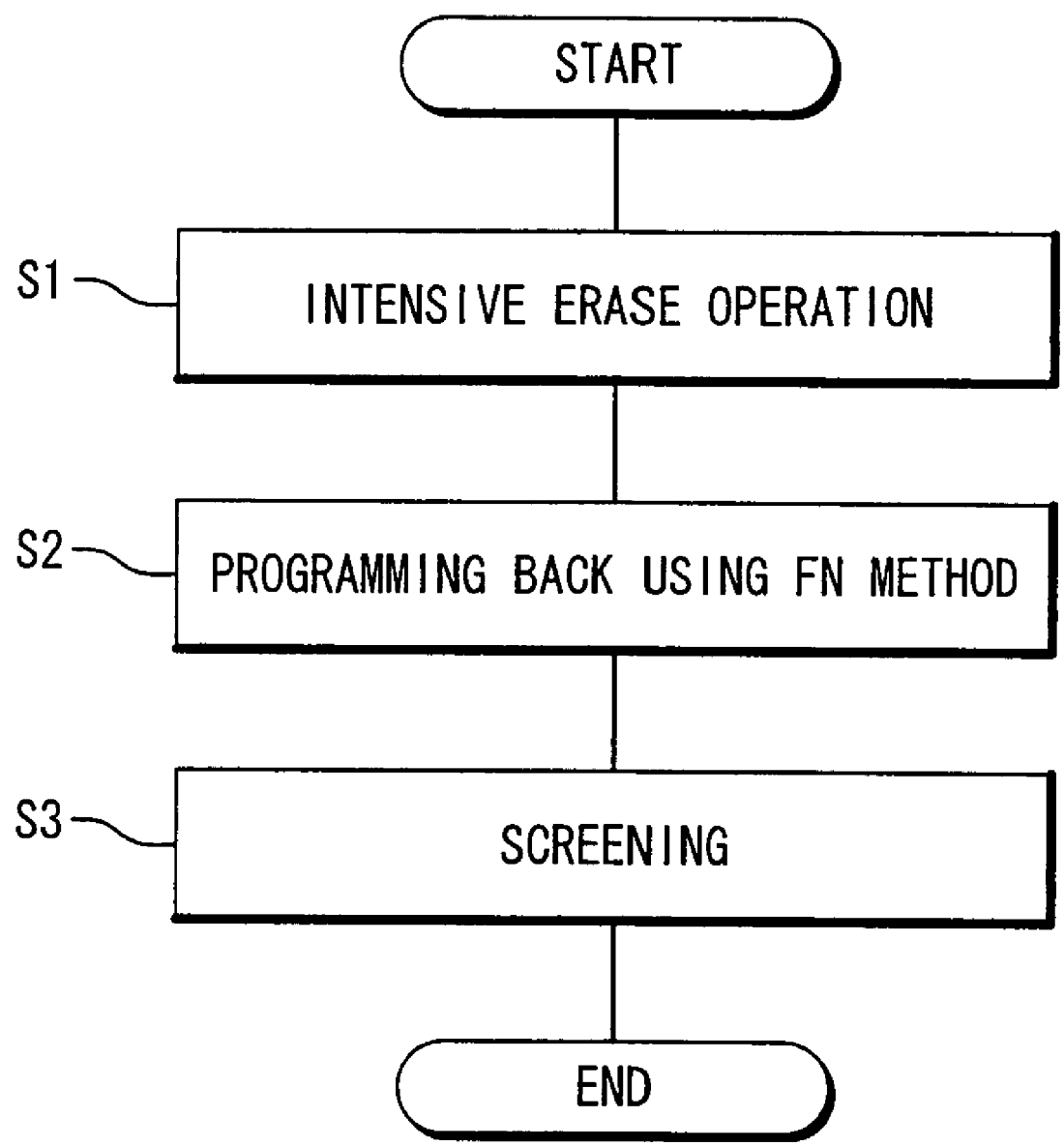
FIG. 7 is a flowchart showing a method of testing the nonvolatile semiconductor memory device according to the present embodiment.

FIG. 7 is a flowchart showing the test/inspection method according to the present embodiment. First, in response to a test signal indicating the test mode, the control circuit 4 activates the above-mentioned erase signal /AER and performs erasing by using the "FN method". Here, the control circuit 4 performs the erasing "intensively" with respect to all the memory cells. For example, the control circuit 4 performs the erasing for a much longer time than in the above-mentioned normal erase mode. As a result, a large number of memory cells become the depression state. In other words, the control circuit 4 performs the erasing intensively enough to bring the memory cell into the depression state (Step S1).

Due to such the intensive erasing, the memory cell that tends to be over-erased is erased more deeply and hence becomes distinct, as compared with a normal memory cell. Moreover, since the high voltage peculiar to the FN method is applied to the memory cell for a long time, a memory cell with a film defect is destroyed. In this manner, it is possible to differentiate the memory cell having a defect from the normal memory cell.

Meanwhile, due to the intensive erasing, a lot of normal memory cells become the depression state. In order to detect in which block the memory cell having a defect exists, it is necessary to make the normal memory cells from the depression state back to a normal state. Obviously also, the depression state needs to be resolved in order to ship the memory chip. Therefore, after the intensive erasing is performed, programming back is performed with respect to all the memory cells.

It should be noted here that to perform the programming back by using the CHE method is virtually impossible. The reason is that a lot of memory cells are being in the depression state as a result of the intensive erasing. When the lot of memory cells are in the depression state, off-leakage currents flow from the lot of memory cells into a bit line. In this case, it is no longer possible to supply a sufficient program current to a programming-back-target memory cell. It is therefore impossible to perform the programming back on the basis of the CHE method.

Consequently, according to the present embodiment, the "FN method" is employed for the programming back during the test/inspection stage. That is, the control circuit 4 performs the programming back of the memory cell by using the FN method in the test mode (Step S2). According to the FN method, a program voltage is not applied to the drain of the memory cell and thus the off-leakage current becomes irrelevant. As a result of the programming back based on the FN method, the normal memory cells return from the depression state back to the normal state. The programming back based on the FN method is appropriately controlled such that the memory cell that tends to be over-erased is maintained in the depression state.

In this manner, the memory cell that tends to be over-erased and the memory cell having a film defect as mentioned above can be detected accurately (Step S3). When such the memory cell having the defect is detected accurately, a block including the detected memory cell can be replaced with a redundancy block. As a result, the possibility that the memory chip is eliminated as an operation defective product is decreased. Therefore, the yield is improved. Furthermore, since potentially defective memory cells are removed, the reliability of the memory chip as a product is improved.

As described above, the nonvolatile semiconductor memory device 1 according to the present embodiment performs the programming back by using the FN method after performing the intensive erasing by using the FN method during a test mode. Consequently, it is possible to accurately detect the memory cell having a defect. To put it the other way around, since a mode to perform the programming back by the FN method is provided, it is possible to perform the intensive erasing in the test/inspection stage without constraint. Due to the intensive erasing, the screening with high accuracy can be achieved.

2. Second Embodiment

Next, a nonvolatile semiconductor memory device according to a second embodiment of the present invention will be described. In the second embodiment, the same reference numerals are given to the same components as those described in the first embodiment, and an overlapping description will be omitted appropriately.

Figure 8:
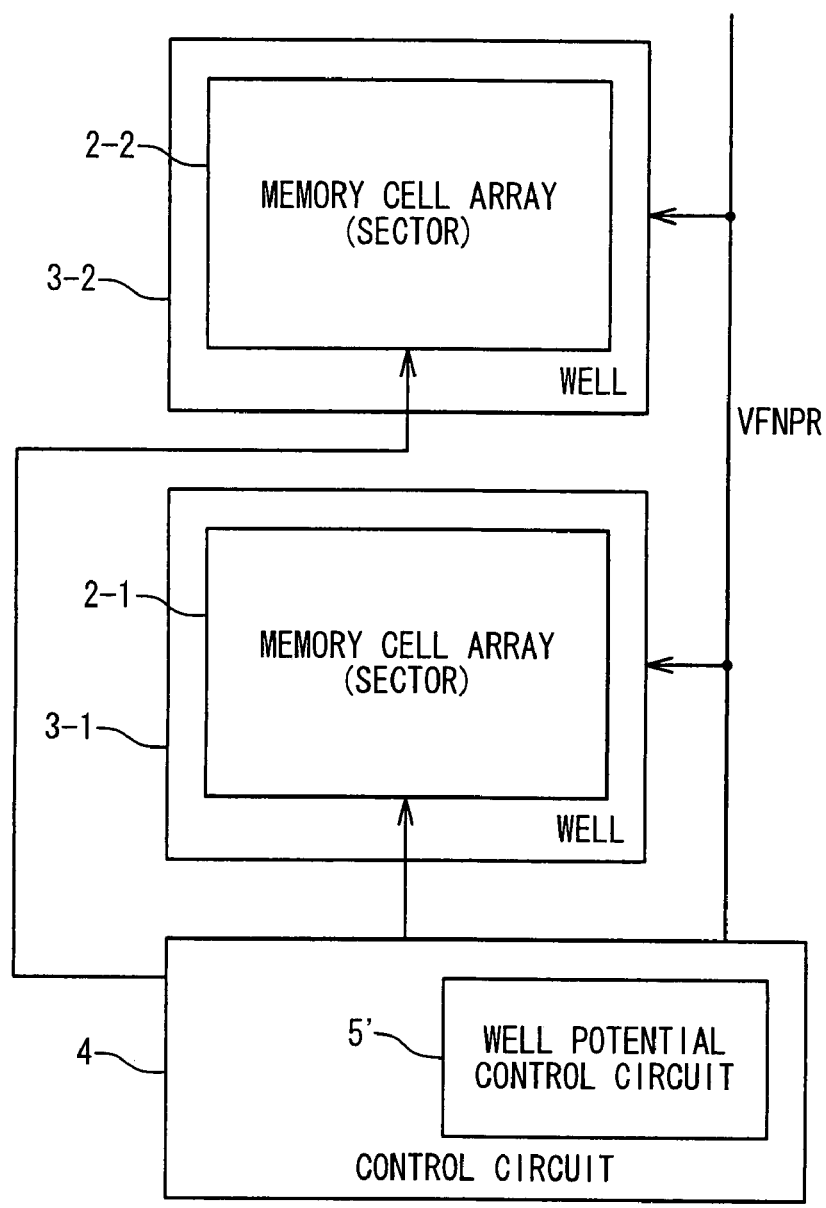
FIG. 8 is a block diagram showing a configuration of a nonvolatile semiconductor memory device according to a second embodiment of the present invention.

FIG. 8 schematically shows a configuration of the nonvolatile semiconductor memory device 1 according to the second embodiment. The nonvolatile semiconductor device 1 is provided with a plurality of memory cell arrays (sectors) 2. The plurality of sectors 2 are formed on a plurality of wells 3, respectively. Each sector 2 includes the memory cells 10 arranged in an array. In FIG. 8, a sector 2-1 formed on a well 3-1 and a sector 2-2 formed on a well 3-2 are shown as an example. The sector 2-1 and the sector 2-2 are arranged in the same sector column.

The control circuit 4 controls programming and erasing of the memory cell 10 with regard to the plurality of sectors 2. Also, the control circuit 4 includes a well potential control circuit 5', and the well potential control circuit 5' controls well potential that is applied to the plurality of wells 3 at the time of the programming/erasing. In particular, the well potential control circuit 5' according to the present embodiment supplies the FN program potential VFNPR collectively to the plurality of sectors 2 at least at the time of the programming back during the test mode.

Figure 9:
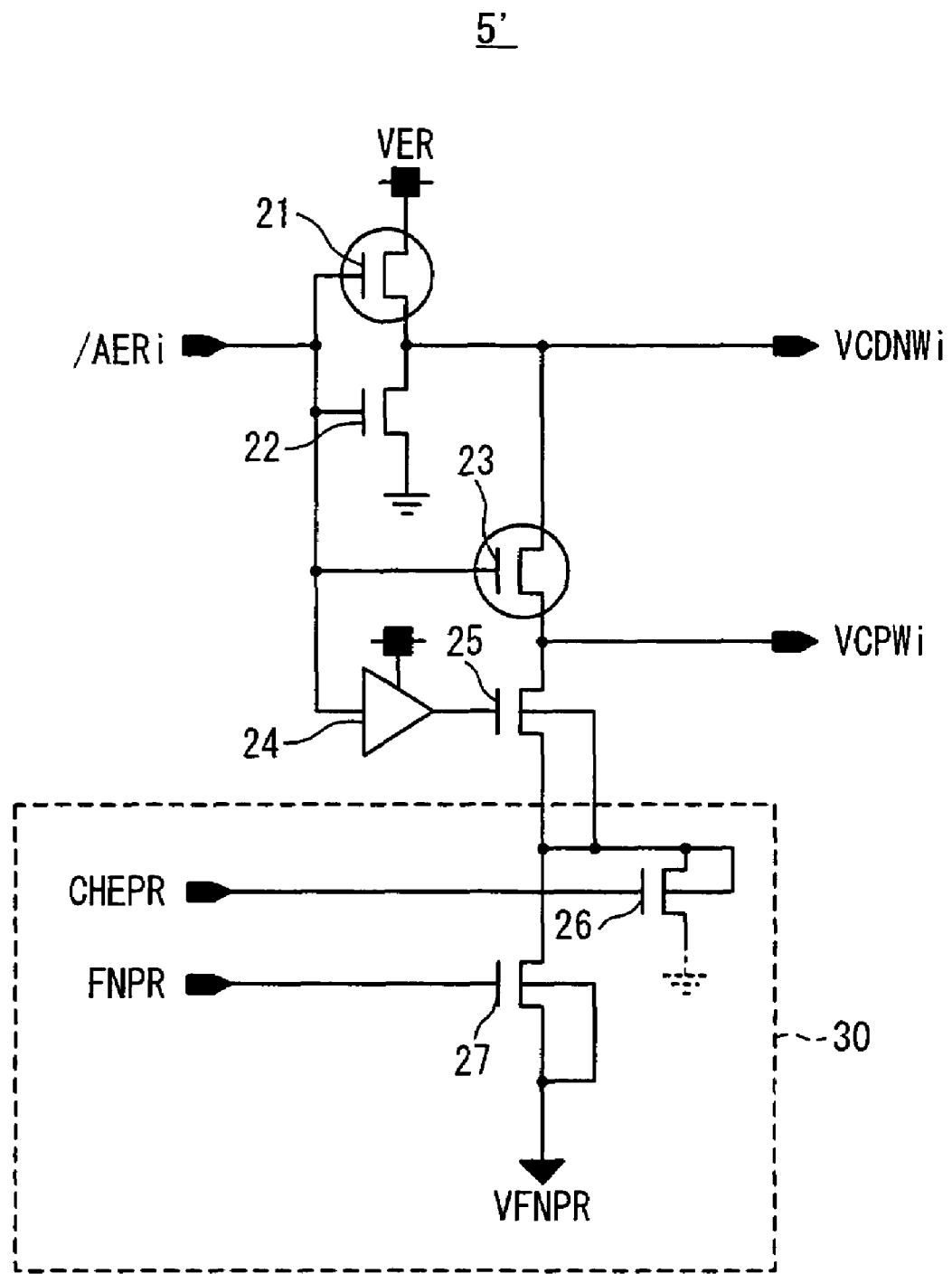
FIG. 9 is a circuit diagram showing a configuration of a well potential control circuit according to the second embodiment.

FIG. 9 shows an example of a configuration of the well potential control circuit 5' according to the present embodiment. In FIG. 9, the NMOS 26 and the NMOS 27 configure a program potential generation circuit 30. The program potential generation circuit 30 outputs the well potential in accordance with the CHE program signal CHEPR and the FN program signal FNPR. More specifically, when the CHE program signal CHEPR is activated, the program potential generation circuit 30 outputs the ground potential GND. On the other hand, when the FN program signal FNPR is activated, the program potential generation circuit 30 outputs the negative FN program potential VFNPR.

In the present embodiment, the program potential generation circuit 30 is provided for the plurality of sectors 2 in the same sector column in common, and the well potential (GND or VFNPR) output from the program potential generation circuit 30 is applied to the wells 3-1, 3-2 . . . in common. A suffix i in FIG. 9 represents respective sectors 2. A signal /AERi is the erase signal /AER input to the sector 2-i (i=1, 2 . . . ). Potentials VCDNWi and VCPWi represent the N-well potential VCDNW applied to the N-well 12 in the sector 2-i and the P-well potential VCPW applied to the P-well 13 in the sector 2-i, respectively.

The control circuit 4 shown in FIG. 8 is provided with the above-described well potential control circuit 5'. In the test mode, the control circuit 4 performs the "intensive erasing" with respect to each of the sectors 2. For example, in a case where the sector 2-1 is a target sector, the control circuit 4 applies the negative potential to the control gate 15 of the memory cell 10 in the target sector 2-1 and applies the ground potential to the control gate 15 of the memory cell 10 in the other sectors 2. Also, the well potential control circuit 5' in the control circuit 4 applies the positive erase potential VER to the well 3-1 on which the target sector 2-1 is formed. Consequently, the intensive erasing is performed exclusively for the memory cell 10 included in the target sector 2-1.

Subsequently, the control circuit 4 performs the programming back with respect to the target sector 2-1. At the time of the programming back, the control circuit 4 applies the positive potential (e.g. 9 V) to the control gate 15 of the memory cell 10 in the target sector 2-1 and applies the ground potential to the control gate 15 of the memory cell 10 in the other sectors 2. Also, the well potential control circuit 5' in the control circuit 4 applies the negative FN program potential VFNPR (e.g. −9 V) to respective P-wells 13 of the plurality of wells 3-1, 3-2 . . . in common. As a result, the programming back is performed exclusively for the memory cell 10 included in the target sector 2-1.

According to the second embodiment, the same effects as in the first embodiment can be obtained. Furthermore, the following additional effect can be obtained. In the above-described embodiments, the circuit for generating the negative FN program potential VFNPR is provided in order to achieve the programming back by the FN method during the test mode. However, such the circuit for generating the negative potential generally needs a very large level shifter. According to the second embodiment, the program potential generation circuit 30 for outputting the negative FN program potential VFNPR is provided for the plurality of sectors 2 in common. Thus, increase in a circuit area is suppressed.

It is apparent that the present invention is not limited to the above embodiments and may be modified and changed without departing from the scope and spirit of the invention.

What is claimed is:

1. A nonvolatile semiconductor memory device comprising:
   a memory cell of a field effect transistor type; and
   a control circuit configured to control programming/erasing of said memory cell,
   wherein in response to a test signal indicating a test mode, said control circuit performs erasing of said memory cell by using FN (Fowler-Nordheim) method and further performs programming back of said memory cell by using FN method.

2. The nonvolatile semiconductor memory device according to claim 1,
   wherein in response to an erase signal indicating a normal erase mode different from said test mode, said control circuit performs erasing of said memory cell by using FN method and further performs programming back of said memory cell by using CHE (Channel Hot Electron) method.

3. The nonvolatile semiconductor memory device according to claim 2,
   wherein said control circuit performs said erasing in said test mode for a longer time than said erasing in said normal erase mode.

4. The nonvolatile semiconductor memory device according to claim 1,
   wherein in said test mode, said control circuit performs said erasing until said memory cell becomes a depression state.

5. The nonvolatile semiconductor memory device according to claim 1,
   wherein said memory cell is formed on a well,
   wherein in said programming back during said test mode, said control circuit applies positive potential to a control gate of said memory cell and applies negative potential to said well.

6. The nonvolatile semiconductor memory device according to claim 1,
   further comprising a plurality of sectors formed on a plurality of wells, respectively,
   wherein each of said plurality of sectors includes said memory cell,
   wherein in said programming back during said test mode, said control circuit applies positive potential to a control gate of said memory cell included in a target sector of said plurality of sectors and applies negative potential to said plurality of wells in common.

7. A nonvolatile semiconductor memory device comprising:
   a memory cell of a field effect transistor type; and
   a control circuit configured to control programming/erasing of said memory cell,
   wherein said control circuit switches a method of said programming between FN (Fowler-Nordheim) method and CHE (Channel Hot Electron) method, depending on an operation mode.

8. A method of testing a nonvolatile semiconductor memory device that includes a memory cell of a field effect transistor type, comprising:
   (A) performing erasing of said memory cell by using FN (Fowler-Nordheim) method;
   (B) performing programming back of said memory cell by using FN method, after said (A) step.

9. The method according to claim 8,
   wherein said (A) step is performed until said memory cell becomes a depression state.

10. The method according to claim 8,
    wherein said memory cell is formed on a well,
    wherein in said (B) step, positive potential is applied to a control gate of said memory cell and negative potential is applied to said well.

11. The method according to claim 8,
    wherein said nonvolatile semiconductor memory device is provided with a plurality of sectors formed on a plurality of wells, respectively, and each of said plurality of sectors includes said memory cell,
    wherein in said (B) step, positive potential is applied to a control gate of said memory cell included in a target sector of said plurality of sectors, and negative potential is applied to said plurality of wells in common.

* * * * *